(12) United States Patent
Su et al.

(10) Patent No.: US 11,842,135 B2
(45) Date of Patent: Dec. 12, 2023

(54) INTEGRATED CIRCUIT LAYOUT GENERATION METHOD AND SYSTEM

(71) Applicant: TAIWAN SEMICONDUCTOR MANUFACTURING COMPANY, LTD., Hsinchu (TW)

(72) Inventors: Ke-Ying Su, Taipei (TW); Ke-Wei Su, Zhubei (TW); Keng-Hua Kuo, Hsinchu (TW); Lester Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 703 days.

(21) Appl. No.: 17/031,610

(22) Filed: Sep. 24, 2020

(65) Prior Publication Data

US 2021/0019467 A1 Jan. 21, 2021

Related U.S. Application Data

(63) Continuation of application No. 16/294,735, filed on Mar. 6, 2019, now Pat. No. 10,796,059.

(60) Provisional application No. 62/646,808, filed on Mar. 22, 2018.

(51) Int. Cl.
*G06F 30/392* (2020.01)
*G06F 30/20* (2020.01)

(52) U.S. Cl.
CPC ............ *G06F 30/392* (2020.01); *G06F 30/20* (2020.01)

(58) Field of Classification Search
CPC ............................... G06F 30/392; G06F 30/20
USPC ........................................................ 716/119
See application file for complete search history.

(56) References Cited

U.S. PATENT DOCUMENTS

| | | | |
|---|---|---|---|
| 5,301,146 A | 4/1994 | Hama | |
| 6,084,277 A | 7/2000 | Disney | |
| 6,271,568 B1 | 8/2001 | Woodruff et al. | |
| 7,260,442 B2 | 8/2007 | Hwang et al. | |
| 8,689,166 B2* | 4/2014 | Lu | G06F 30/367 716/55 |
| 9,256,709 B2 | 2/2016 | Yu et al. | |
| 2013/0289964 A1* | 10/2013 | Lu | G06F 30/367 703/13 |
| 2014/0040838 A1 | 2/2014 | Liu et al. | |

(Continued)

FOREIGN PATENT DOCUMENTS

| | | |
|---|---|---|
| TW | 201636882 A | 10/2016 |
| TW | 201734868 A | 10/2017 |
| TW | 201937298 A | 9/2019 |

OTHER PUBLICATIONS

Office Action dated Dec. 2, 2021 for corresponding case No. TW 11021190330. (pp. 1-3).

(Continued)

*Primary Examiner* — Suchin Parihar
(74) *Attorney, Agent, or Firm* — Hauptman Ham, LLP (57) ABSTRACT

A method of generating an integrated circuit (IC) layout diagram of an IC device includes receiving the IC layout diagram of the IC device, the IC layout diagram including a gate region having a width across an active region. The width is divided into a plurality of width segments based on a location of a gate via, and a simulation is performed based on the IC layout diagram and including an effective resistance calculated using at least one width segment of the plurality of width segments.

20 Claims, 8 Drawing Sheets

(56) References Cited

U.S. PATENT DOCUMENTS

| | | | | |
|---|---|---|---|---|
| 2015/0143325 A1* | 5/2015 | Lu | ............................ | G06F 30/20 |
| | | | | 716/136 |
| 2015/0278429 A1 | 10/2015 | Chang | | |
| 2016/0209753 A1 | 7/2016 | Zhao et al. | | |
| 2019/0340328 A1 | 11/2019 | Su et al. | | |
| 2022/0343054 A1* | 10/2022 | Su | ............................ | G03F 1/70 |

OTHER PUBLICATIONS

Razavi, B., et al. "Impact of Distributed Gate Resistance on the Performance of MOS Devices" IEEE Transactions on Circuits and Systems-I: Fundamental Theory and Applications, vol. 41, No. II, pp. 750-754 Nov. 1994.

* cited by examiner

INTEGRATED CIRCUIT LAYOUT GENERATION METHOD AND SYSTEM

PRIORITY CLAIM

The present application is a continuation of U.S. application Ser. No. 16/294,735, filed Mar. 6, 2019, which claims the priority of U.S. Provisional Application No. 62/646,808, filed Mar. 22, 2018, each of which is incorporated herein by reference in its entirety.

BACKGROUND

The ongoing trend in miniaturizing integrated circuits (ICs) has resulted in smaller devices which consume less power, yet provide more functionality at higher speeds. Miniaturization has been achieved through design and manufacturing innovations tied to increasingly strict specifications. Various electronic design automation (EDA) tools are used to generate, revise, and verify designs for semiconductor devices while ensuring that design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an effective gate resistance of an IC device is modeled by dividing a gate width into width segments based on one or more gate via locations along the gate width in a layout diagram of the IC device, thereby improving accuracy and avoid underestimating gate resistance values compared to gate resistance modeling methods that do not divide a gate width based on one or more gate via locations. Additional accuracy improvements are provided by applying a distributed resistance model to each of the width segments in some embodiments, and by applying effective resistance values to delta resistance networks in some embodiments.

Figure 1:
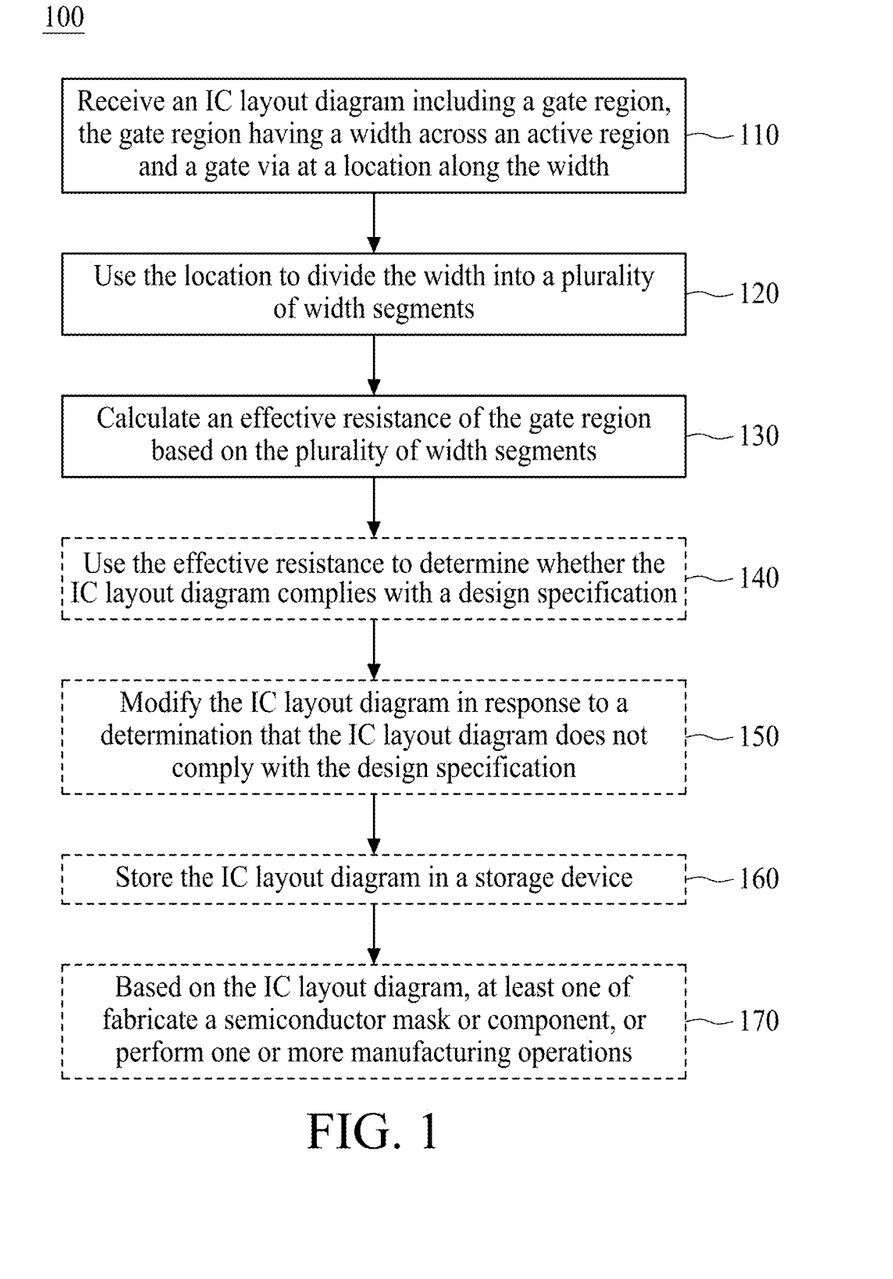
FIG. 1 is a flowchart of a method of generating a layout diagram an IC device, in accordance with some embodiments.

FIG. 1 is a flowchart of a method 100 of generating a layout diagram of an IC device, in accordance with some embodiments. Generating the layout diagram of the IC device includes modeling the IC device based on an initial IC layout diagram of the IC device, and the initial IC layout diagram includes a gate region having a width across an active region and at least one gate via at a location along the width. In some embodiments, modeling the IC device includes modeling the gate region using a resistance network model, e.g., a delta resistance network or a star resistance network.

In some embodiments, modeling the IC device includes modeling a transistor, e.g., a planar transistor or a fin field-effect transistor (FinFET). In some embodiments, the transistor is one transistor of a plurality of transistors included in the IC device, non-limiting examples of which include memory circuits, logic devices, processing devices, signal processing circuits, or the like.

In some embodiments, some or all of method 100 is executed by a processor of a computer. In some embodiments, some or all of method 100 is executed by a processor 702 of an EDA system 700, discussed below with respect to FIG. 7.

Some or all of the operations of method 100 are capable of being performed as part of a design procedure performed in a design house, e.g., a design house 820 discussed below with respect to FIG. 8.

In some embodiments, the operations of method 100 are performed in the order depicted in FIG. 1. In some embodiments, the operations of method 100 are performed in an order other than the order depicted in FIG. 1. In some embodiments, one or more operations are performed before, between, during, and/or after performing one or more operations of method 100. The operations of method 100 are illustrated using FIGS. 2A-6 as discussed below.

Each of FIGS. 2A, 3A, 4A, and 5A depicts a non-limiting example of a respective IC layout diagram 200A, 300A, 400A, or 500A of an IC device, having a direction X, and a direction Y perpendicular to direction X. The orientations of IC layout diagrams 200A, 300A, 400A, and 500A depicted with respect to directions X and Y are non-limiting examples used for the purpose of illustration. In various embodiments, one or more of IC layout diagrams 200A, 300A, 400A, or 500A has an orientation with respect to directions X and Y other than that depicted in the corresponding one or more of FIG. 2A, 3A, 4A, or 5A.

Each of IC layout diagrams 200A, 300A, 400A, and 500A includes an active region A and a gate region G. IC layout diagram 200A includes a gate via VG1, IC layout diagram 300A includes gate vias VG2 and VG3, IC layout diagram 400A includes gate vias VG4, VG5, and VG6, and IC layout diagram 500A includes gate vias VG4, VG6, VG7, and VG8.

Active region A is a region in the IC layout diagram included in a manufacturing process as part of defining an active area, also referred to as an oxide diffusion or definition (OD), in a semiconductor substrate in which one or more IC device features, e.g., a source/drain region, is formed. In various embodiments, an active area is an n-type or p-type active area of a planar transistor or a FinFET.

Gate region G is a region in the IC layout diagram included in the manufacturing process as part of defining a gate structure in the IC device including at least one of a conductive material or a dielectric material. In various embodiments, the gate structure corresponding to gate region G includes at least one conductive material, e.g., a metal and/or a polysilicon material, overlying at least one dielectric material, e.g., a silicon dioxide and/or a high-k dielectric material.

Each gate via VG1-VG8 is a region in the IC layout diagram included in the manufacturing process as part of defining one or more segments of one or more conductive layers in the IC device configured to form an electrical connection between the gate structure corresponding to gate region G and one or more conductive layer segments overlying the gate structure corresponding to gate region G. In various embodiments, the one or more conductive layer segments formed based on each gate via VG1-VG8 includes a metal, e.g., copper, and forms an electrical connection to a metal zero, a metal one, or a metal two layer of the IC device.

In various embodiments, each of IC layout diagrams 200A, 300A, 400A, and 500A includes features in addition to active region A, gate region G, and gate vias VG1-VG8, e.g., one or more additional active regions, gate regions, and/or gate vias, and/or one or more isolation regions, source/drain regions, well regions, and/or interconnect features, that are not depicted in FIGS. 2A, 3A, 4A, and 5A for the purpose of clarity.

Gate region G extends across active region A from a location N1 on a first edge of active region A to a location N2 on a second edge of active region A opposite the first edge, thereby defining a width W. Gate region G includes a location T along width W midway between locations N1 and N2. In the embodiments depicted in FIGS. 2A, 3A, 4A, and 5A, width W extends along direction Y. In some embodiments, width W extends along direction X.

In the embodiments depicted in FIGS. 2A, 3A, 4A, and 5A, gate region G extends beyond locations N1 and N2 such that portions of gate region G are outside of active region A. In various embodiments, one or both portions of gate region G that extend beyond locations N1 and N2 overlap one or more isolation regions. In various embodiments, gate region G does not extend beyond one or both of locations N1 or N2. In various embodiments, an entirety of gate region G is inside active region A or gate region G includes one or more borders shared with active region A.

Figure 2A:
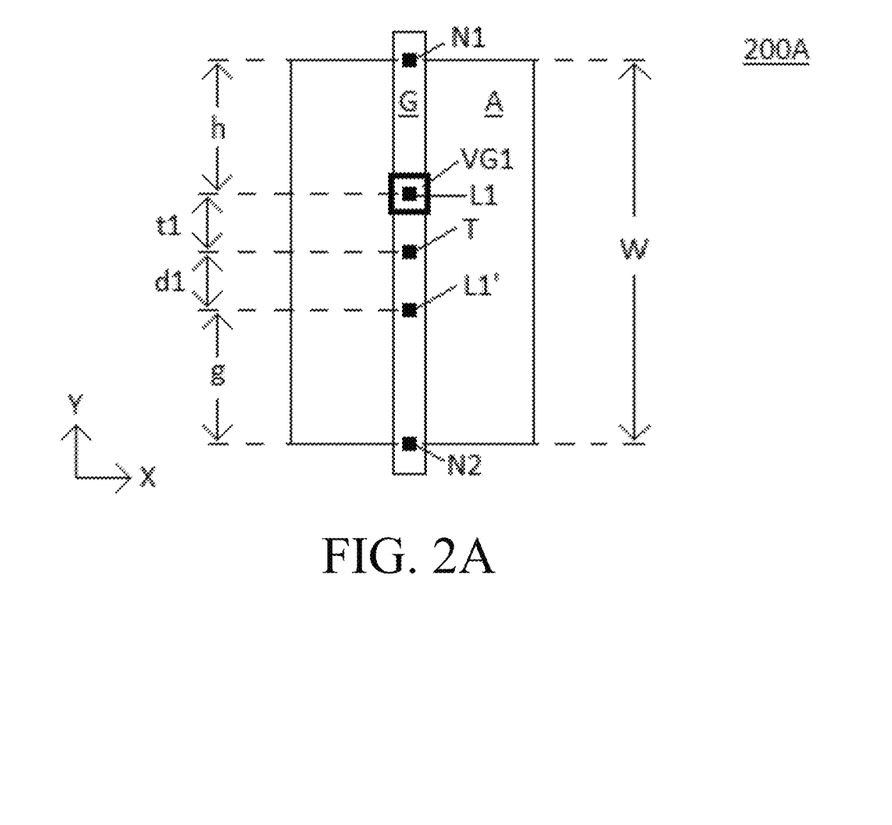
FIG. 2A depicts a layout diagram of an IC device, in accordance with some embodiments.

In the embodiment depicted in FIG. 2A, IC layout diagram 200A includes gate via VG1 positioned at a location L1 along width W, and an additional reference location L1' along width W. In the embodiment depicted in FIG. 3A, IC layout diagram 300A includes gate vias VG2 and VG3 positioned at respective locations L2 and L3 along width W. In the embodiment depicted in FIG. 4A, IC layout diagram 400A includes gate via VG4 positioned at location N1, gate via VG5 positioned at location T, and gate via VG6 positioned at location N2. In the embodiment depicted in FIG. 5A, IC layout diagram 500A includes gate via VG4 positioned at location N1, gate via VG6 positioned at location N2, and gate vias VG7 and VG8 positioned at respective locations L7 and L8 along width W.

Each of FIGS. 2B, 3B, 4B, and 5B depicts a respective one of gate resistance models 200B, 300B, 400B, and 500B corresponding to respective IC layout diagrams 200A, 300A, 400A, and 500A. Each of gate resistance models 200B, 300B, 400B, and 500B includes locations N1, N2, and T, gate resistance model 200B includes gate via VG1 and location L1, gate resistance model 300B includes gate vias VG2 and VG3 and locations L2 and L3, gate resistance model 400B includes gate vias VG4, VG5, and VG6, and gate resistance model 500B includes gate vias VG4, VG6, VG7, and VG8 and locations L7 and L8, each discussed above with respect to FIGS. 2A, 3A, 4A, and 5A. As discussed below, each of gate resistance models 200B, 300B, 400B, and 500B is configured as a delta resistance network based on a respective one of IC layout diagram 200A, 300A, 400A, or 500A.

At operation 110, an IC layout diagram of the IC device is received. The IC layout diagram includes a gate region, the gate region having a width across an active region and a gate via positioned at a location along the width. The width extends from a first edge of the active region to a second edge of the active region opposite the first edge. In some embodiments, the width extends from location N1 to location N2, discussed above with respect to FIGS. 2A-5B.

The location is between the first and second edges of the active region. In some embodiments, the gate via is one gate via of a plurality of gate vias, the location is one location of a corresponding plurality of locations along the width, and at least one location of the plurality of locations is between the first and second edges of the active region.

In various embodiments, receiving the IC layout diagram includes receiving IC layout diagram 200A including one or more gate vias positioned at locations as discussed above with respect to FIGS. 2A-5B.

Receiving the IC layout diagram includes receiving the IC layout diagram using a processor of a computer, e.g., processor 702 of EDA system 700, discussed below with respect to FIG. 7.

At operation 120, the location is used to divide the width into a plurality of width segments. Dividing the width into the plurality of width segments includes dividing an entirety of the width into the plurality of width segments. Accordingly, each width segment of the plurality of width segments has a length such that a sum of the lengths corresponding to each width segment of the plurality of width segments is equal to the width.

In various embodiments, dividing the width into the plurality of width segments includes dividing the width into two, three, or four width segments. In some embodiments, dividing the width into the plurality of width segments includes dividing the width into more than four width segments.

In some embodiments, the plurality of width segments includes a first width segment extending from the location to the first edge of the active region. In some embodiments, the plurality of width segments includes a second width segment extending from the location to the second edge of the active region. In some embodiments, the plurality of width segments includes a width segment extending from the location to a center of the width.

In some embodiments, the gate via is one gate via of a plurality of gate vias at a corresponding plurality of locations along the width, and dividing the width into the plurality of width segments includes using more than one location of the plurality of locations. In some embodiments, dividing the width into the plurality of width segments includes using each location of the plurality of locations.

In some embodiments, the gate via is one gate via of a plurality of gate vias at a corresponding plurality of locations along the width, and the plurality of width segments includes a first width segment extending from a first location to the first edge of the active region and a second width segment extending from a second location to the second edge of the active region.

In some embodiments, the IC layout diagram is IC layout diagram 200A, and dividing the width into the plurality of width segments includes dividing width W into width segments h, t1, d1, and g using locations N1, L1, T, L1', and N2, as depicted in FIG. 2A. Width segment h extends from location N1 to location L1, width segment t1 extends from location L1 to location T, width segment d1 extends from location T to location L1', and width segment g extends from location L1' to location N2.

In the embodiment depicted in FIG. 2A, locations L1 and L1' are symmetric about location T such that width segments t1 and d1 have a same length, and width segments h and g have a same length. In some embodiments, locations L1 and L1' are not symmetrical about location T, width segments t1 and d1 have differing lengths, and width segments h and g have differing lengths. In various embodiments, one or both of width segments t1 or d1 has a length that is less than, equal to, or greater than a length of one or both of width segments h and g.

In some embodiments, dividing the width into the plurality of width segments includes dividing width W into fewer than the four width segments h, t1, d1, and g depicted in FIG. 2A by combining two or more of width segments h, t1, d1, or g into a single width segment. In some embodiments, dividing the width into the plurality of width segments includes dividing width W into a first width segment h and a second width segment including t1, d1, and g, thereby dividing width W into the plurality of width segments using only locations N1, L1, and N2.

Figure 3A:
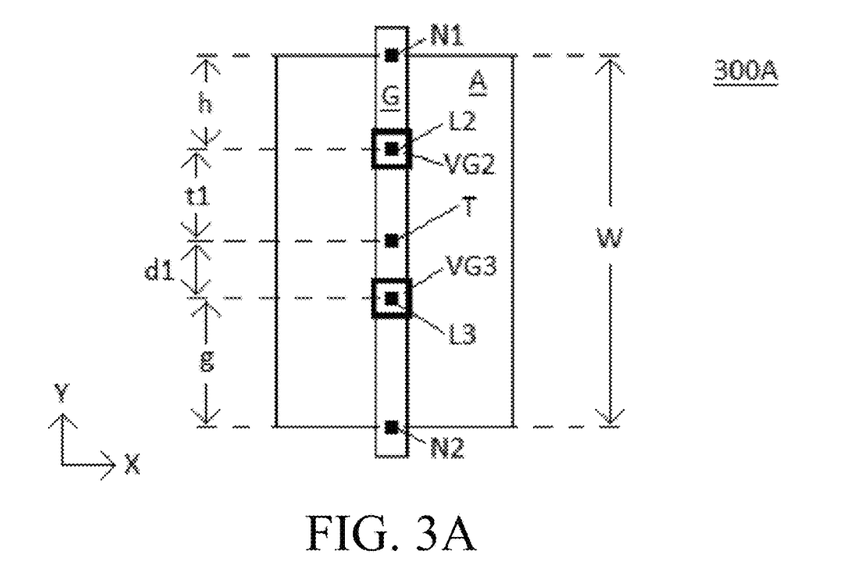
FIG. 3A depicts a layout diagram of an IC device, in accordance with some embodiments.

In some embodiments, the IC layout diagram is IC layout diagram 300A, and dividing the width into the plurality of width segments includes dividing width W into width segments h, t1, d1, and g using locations N1, L2, T, L3, and N2, as depicted in FIG. 3A. Width segment h extends from location N1 to location L2, width segment t1 extends from location L2 to location T, width segment d1 extends from location T to location L3, and width segment g extends from location L3 to location N2.

In the embodiment depicted in FIG. 3A, each one of width segments h, t1, d1, and g has a length that differs from the lengths of the other ones of width segments h, t1, d1, and g. In various embodiments, two or more of width segments h, t1, d1, and g have a same length.

Figure 4A:
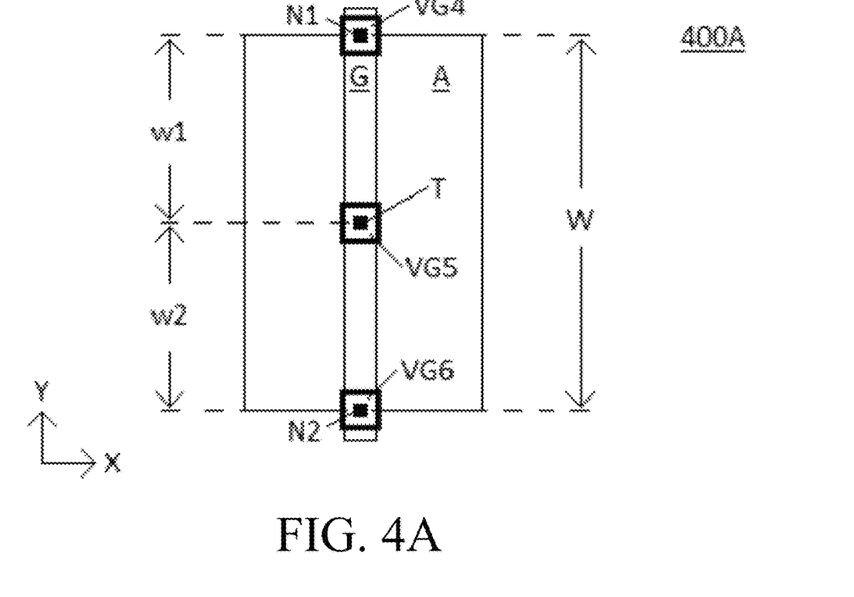
FIG. 4A depicts a layout diagram of an IC device, in accordance with some embodiments.

In some embodiments, the IC layout diagram is IC layout diagram 400A, and dividing the width into the plurality of width segments includes dividing width W into width segments w1 and w2 using locations N1, T, and N2, as depicted in FIG. 4A. Width segment w1 extends from location N1 to location T, and width segment w2 extends from location T to location N2.

In the embodiment depicted in FIG. 4A, because gate vias VG4 and VG6 are positioned at respective locations N1 and N2, and gate via VG5 is positioned at location T midway between locations N1 and N1, width segments w1 and w2 have a same length. In some embodiments, gate via VG5 is positioned at a location other than location T, and width segments w1 and w2 have differing lengths.

In some embodiments, one or both of gate vias VG4 or VG6 is positioned at a location (not shown) along width W other than respective locations N1 and N2, and dividing the width into the plurality of width segments includes dividing width W into one or more width segments (not shown) in addition to width segments w1 and w2.

Figure 5A:
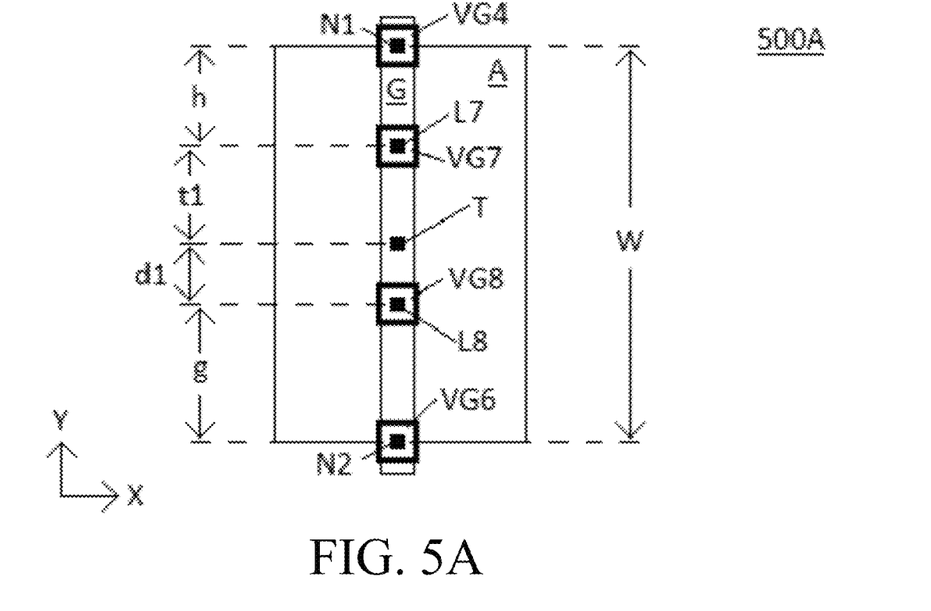
FIG. 5A depicts a layout diagram of an IC device, in accordance with some embodiments.

In some embodiments, the IC layout diagram is IC layout diagram 500A, and dividing the width into the plurality of width segments includes dividing width W into width segments h, t1, d1, and g using locations N1, L7, T, L8, and N2, as depicted in FIG. 5A. Width segment h extends from location N1 to location L7, width segment t1 extends from location L7 to location T, width segment d1 extends from location T to location L8, and width segment g extends from location L8 to location N2.

In the embodiment depicted in FIG. 5A, each one of width segments h, t1, d1, and g has a length that differs from the lengths of the other ones of width segments h, t1, dl, and g. In various embodiments, two or more of width segments h, t1, d1, and g have a same length.

In some embodiments, one or both of gate vias VG4 or VG6 is positioned at a location (not shown) along width W other than respective locations N1 and N2, and dividing the width into the plurality of width segments includes dividing width W into one or more width segments (not shown) in addition to width segments h, t1, d1, and g.

At operation 130, an effective resistance of the gate region is calculated based on the plurality of width segments. The effective resistance is expressed in terms of an expected resistance of a gate structure manufactured in accordance with the gate region. In some embodiments, the expected resistance is an expected resistance Rg of the gate structure corresponding to gate region G between locations corresponding to locations N1 and N2 along width W, discussed above with respect to FIGS. 2A-5B.

Calculating the effective resistance based on the plurality of width segments includes using the length of at least one of the width segments to derive the effective resistance from the expected resistance of the gate structure. In various embodiments, calculating the effective resistance based on the plurality of width segments includes using the lengths of some or all of the width segments of the plurality of width segments.

In some embodiments, calculating the effective resistance includes applying a distributed resistance model to each width segment of the plurality of width segments. In some embodiments, calculating the effective resistance includes applying a distributed resistance model to a thermal noise calculation for each width segment. In some embodiments, calculating the effective resistance includes applying, to each width segment, a distributed resistance model based on a contact at one end of a gate found in Razavi, B., Yan, R., and Lee, K. F. "*Impact of Distributed Gate Resistance on the Performance of MOS Devices*" IEEE Transactions on Circuits and Systems-I: Fundamental Theory and Applications, Vol. 41, No. II, pages 750-754 (November 1994, hereinafter "Razavi"), the entirety of which is hereby incorporated by reference.

In some embodiments, calculating the effective resistance of the gate region includes using a resistance network, e.g., a delta resistance network or a star resistance network, to model the gate region. In various embodiments, calculating the effective resistance of the gate region includes using a delta resistance network included in one of gate resistance models 200B, 300B, 400B, and 500B, discussed below and above with respect to FIG. 2B, 3B, 4B, or 5B.

In some embodiments, calculating the effective resistance based on the plurality of width segments includes calculating the effective resistance based on width segments h, t1, d1, and g, discussed above with respect to IC layout diagram 200A and FIG. 2A. At least one ratio of a length of a width segment h, t1, d1, or g to width W is used to derive an effective resistance R1 from expected gate resistance Rg.

In some embodiments, by applying the distributed resistance model of Razavi to width segments h, t1, d1, and g of IC layout diagram 200A, an effective resistance R1 is given by $$R1 = (Rg/3) \times (1 - 3x + 3x^2), \quad (1)$$

wherein x is a ratio defined as the length of each of width segments t1 and d1 divided by width W, and an effective resistance R2 is given by $$R2 = Rg - (3 \times R1). \quad (2)$$

Based on the positioning of location L1 relative to locations N1 and N2, x has a value that ranges from zero to one, R1 has a value that ranges from Rg/12 to Rg/3, and R2 has a value that ranges from zero to 3/4×Rg.

Figure 2B:
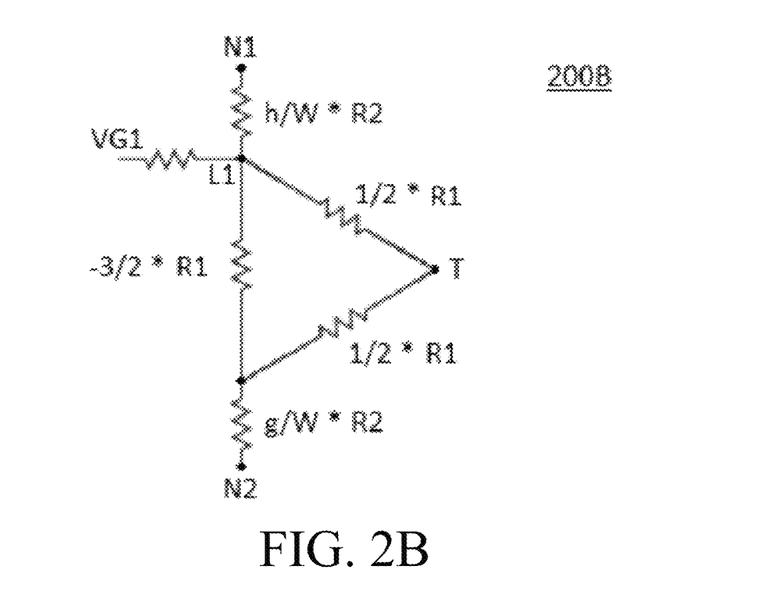
FIG. 2B depicts a gate resistance model, in accordance with some embodiments.

In some embodiments, calculating the effective resistance includes applying the effective resistances R1 and R2 to gate resistance model 200B depicted in FIG. 2B. Gate resistance model 200B thereby includes a delta resistance network of two lumped resistors connected at location T, each having a value of 1/2×R1, and a lumped resistor between locations N1 and N2 having a value of −3/2×R1. Gate resistance model 200B thereby also includes a lumped resistor between location N1 and the delta resistance network having a value of h/W×R2, a lumped resistor between the delta resistance network and location N2 having a value of g/W×R2, and a lumped resistor representing gate via VG1 connected to the delta resistance network at location L1.

By applying the effective resistances R1 and R2, based on width segments h, t1, d1, and g, to the lumped resistances depicted in FIG. 2B, gate resistance model 200B is usable in one or more modeling operations, e.g., one or more modeling operations executed by EDA system 700, discussed below with respect to FIG. 7, for a circuit based on an IC layout diagram that includes IC layout diagram 200A.

In some embodiments, calculating the effective resistance based on the plurality of width segments includes calculating the effective resistance based on width segments h, t1, d1, and g, discussed above with respect to IC layout diagram 300A and FIG. 3A. At least one ratio of a length of a width segment h, t1, d1, or g to width W is used to derive an effective resistance R11 from expected gate resistance Rg.

Figure 6:
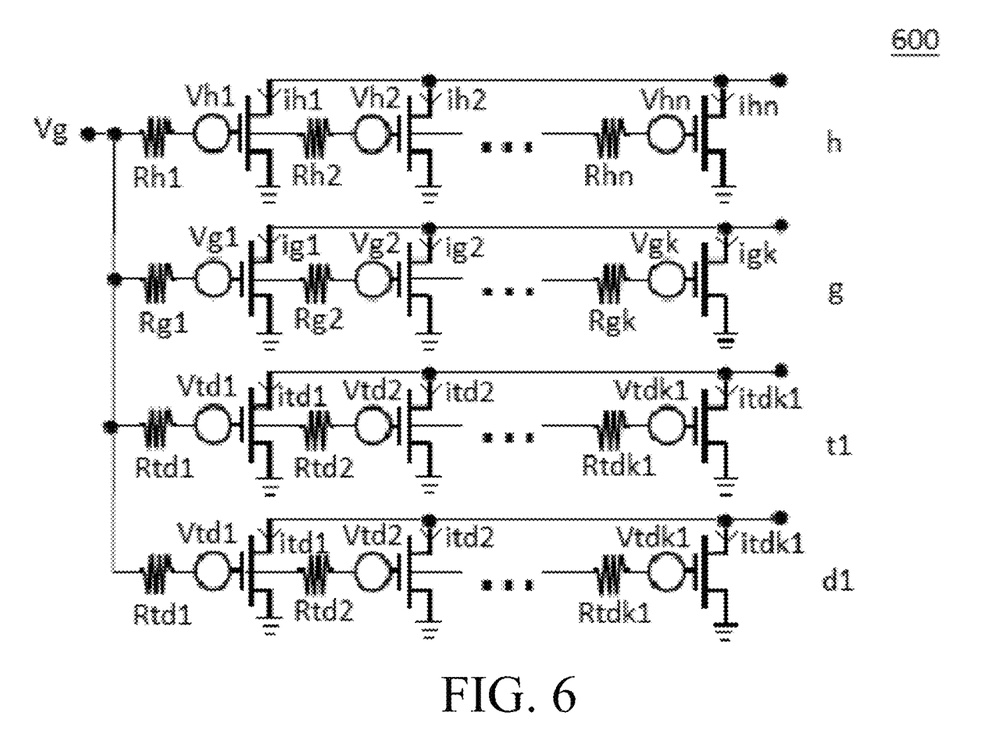
FIG. 6 depicts a gate resistance model, in accordance with some embodiments.

FIG. 6 depicts a non-limiting example of a gate resistance model 600 usable to apply the distributed resistance model of Razavi to width segments h, t1, d1, and g of IC layout diagram 300A to calculate effective resistance R11. For the purpose of simplification, gate resistance model 600 is based on width segments t1 and d1 having a same length instead of having lengths based on location T as depicted in FIG. 3A.

The distributed resistance model of Razavi is based on a gate contacted at one end of the gate. Gate resistance model 600 applies the distributed resistance model of Razavi to each of width segment h contacted by gate via VG2, width segment t1 contacted by gate via VG2, width segment d1 contacted by gate via VG3, and width segment g contacted by gate via VG3.

Gate resistance model 600 represents a single transistor (not shown) having a transconductance Gm as a plurality of individual transistors (not labeled) configured in parallel between a gate voltage Vg and ground, thereby representing portions of gate region G distributed along width W. Each width segment includes a distributed gate resistance represented as a series of resistors, and each resistor corresponds to a noise voltage and a resultant noise current that are used to derive an effective resistance expression.

Width segment h includes n resistors Rh1-Rhn, noise voltages Vh1-Vhn, and currents ih1-ihn, width segment g includes k resistors Rg1-Rgk, noise voltages Vg1-Vgk, and currents ig1-igk, and each of width segments t1 and d1 includes k1 resistors Rtd1-Rtdk1, noise voltages Vtd1-Vtdk1, and currents itd1-itdk1. Each individual transistor has a fractional transconductance gm equal to the single transistor transconductance Gm divided by the total number of individual transistors w, equal to n+k+(2×k1).

A total noise current iT includes noise currents through each of width segments h, g, t1, and d1, and is given by $$\begin{aligned}
iT &= ih1 + ih2 + \ldots + ihn + ig1 + ig2 + \ldots + igk + 2 \times \\
&\quad (itd1 + itd2 + \ldots + itdk1) \\
&= gm \times [Vh1 + (Vh1 + Vh2) + \ldots + (Vh1 + Vh2 + \ldots + Vhn) + \\
&\quad Vg1 + (Vg1 + Vg2) + \ldots + (Vg1 + Vg2 + \ldots + Vgk) + \\
&\quad 2 \times (Vtd1 + (Vtd1 + Vtd2) + \ldots + (Vtd1 + Vtd2 + \ldots + Vtdk1)] \\
&= gm \times [n \times Vh1 + (n-1)Vh2 + \ldots + Vgn + k \times Vg1 + \\
&\quad (k-1)Vg2 + \ldots + Vgk + 2 \times (k1 \times Vtd1 + (k1-1)Vtd2 + \ldots + \\
&\quad Vtdk1)].
\end{aligned}$$

Applying the substitutions from Razavi yields $$\begin{aligned}
iT^2 &= Gm^2(4kTB)Rg[2(n^3 + k^3 + 2k1^3) + 3(n^2 + k^2 + 2k1^2) + \\
&\quad (n + k + 2k1)]/6w^3 \\
&= Gm^2(4kTB) \times R11,
\end{aligned}$$

wherein k is Boltzmann's constant, T is absolute temperature, and B is transistor bandwidth. Effective resistance R11 is thereby given by $$R11 = (Rg/12) \ast (3x^3 + 3y^3 + 3x^2 + 3y^2 + 6xy - 3x^2y - 3y^2x - 3x - 3y + 1), \quad (3)$$

wherein x is a ratio defined as the length of width segment h divided by width W, y is a ratio defined as the length of width segment g divided by width W. An effective resistance R22 is further given by $$R22 = Rg - (3 \times R11). \quad (4)$$

Figure 3B:
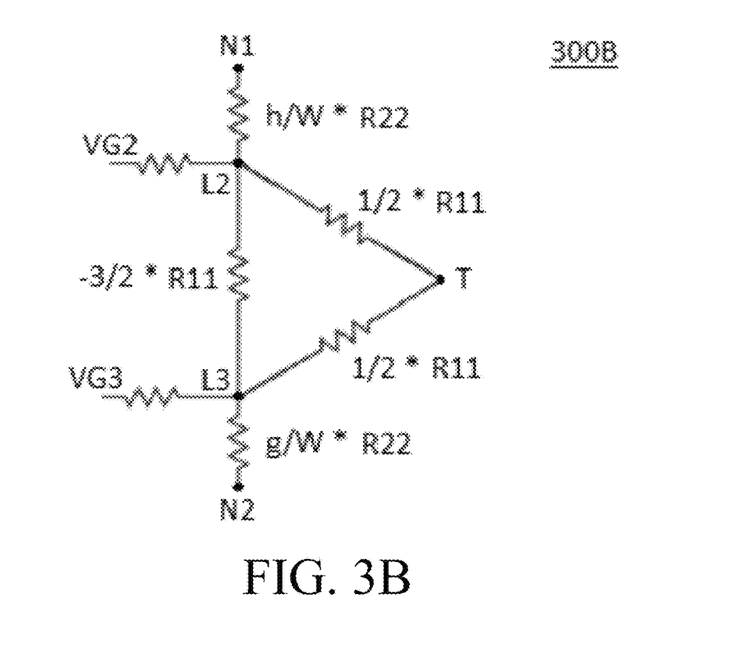
FIG. 3B depicts a gate resistance model, in accordance with some embodiments.

In some embodiments, calculating the effective resistance includes applying the effective resistances R11 and R22 to gate resistance model 300B depicted in FIG. 3B. Gate resistance model 300B thereby includes a delta resistance network of two lumped resistors connected at location T, each having a value of 1/2×R11, and a lumped resistor between locations N1 and N2 having a value of −3/2×R11. Gate resistance model 300B thereby also includes a lumped resistor between location N1 and the delta resistance network having a value of h/W×R22, a lumped resistor between the delta resistance network and location N2 having a value of g/W×R22, a lumped resistor representing gate via VG2 connected to the delta resistance network at location L2, and a lumped resistor representing gate via VG3 connected to the delta resistance network at location L3.

By applying the effective resistances R11 and R22, based on width segments h, t1, d1, and g, to the lumped resistances depicted in FIG. 3B, gate resistance model 300B is usable in one or more modeling operations, e.g., one or more modeling operations executed by EDA system 700, discussed below with respect to FIG. 7, for a circuit based on an IC layout diagram that includes IC layout diagram 300A.

In some embodiments, calculating the effective resistance based on the plurality of width segments includes calculating the effective resistance based on width segments w1 and w2, discussed above with respect to IC layout diagram 400A and FIG. 4A. At least one ratio of a length of a width segment w1 or w2 to width W is used to derive an effective resistance R11 from expected gate resistance Rg.

In some embodiments, by applying the distributed resistance model of Razavi to width segments w1 and w2 of IC layout diagram 400A, an effective resistance R11 is given by $$R11 = (Rg/12) \times (1 - 3x + 3x^2), \quad (5)$$

wherein x is a ratio defined as the length of each of width segments w1 and w2 divided by width W, and effective resistance R22 is given by equation (4).

Figure 4B:
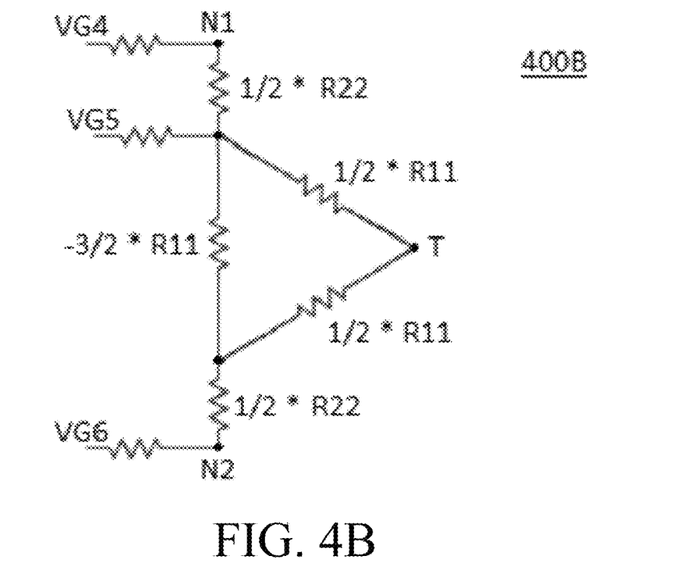
FIG. 4B depicts a gate resistance model, in accordance with some embodiments.

In some embodiments, calculating the effective resistance includes applying the effective resistances R11 and R22 to gate resistance model 400B depicted in FIG. 4B. Gate resistance model 400B thereby includes a delta resistance network of two lumped resistors connected at location T, each having a value of 1/2×R11, and a lumped resistor between locations N1 and N2 having a value of −3/2×R11. Gate resistance model 400B thereby also includes a lumped resistor between location N1 and the delta resistance network having a value of h/W x R22, a lumped resistor between the delta resistance network and location N2 having a value of g/W×R22, and a lumped resistor representing gate via VG5 connected to the delta resistance network.

By applying the effective resistances R11 and R22, based on width segments w1 and w2, to the lumped resistances depicted in FIG. 4B, gate resistance model 400B is usable in one or more modeling operations, e.g., one or more modeling operations executed by EDA system 700, discussed below with respect to FIG. 7, for a circuit based on an IC layout diagram that includes IC layout diagram 400A.

In some embodiments, calculating the effective resistance based on the plurality of width segments includes calculating the effective resistance based on width segments h, t1, d1, and g, discussed above with respect to IC layout diagram 500A and FIG. 5A. At least one ratio of a length of a width segment h, t1, d1, or g to width W is used to derive an effective resistance R11 from expected gate resistance Rg.

In some embodiments, by applying the distributed resistance model of Razavi to width segments h, t1, d1, and g of IC layout diagram 500A, an effective resistance R11 is given by $$R11 = (Rg/12) \times (3x^2 + 3y^2 + 6xy - 3x^2y - 3y^2x - 3x - 3y + 1), \quad (6)$$

wherein x is a ratio defined as the length of width segment h divided by width W, y is a ratio defined as the length of width segment g divided by width W, and effective resistance R22 is given by equation (4).

Figure 5B:
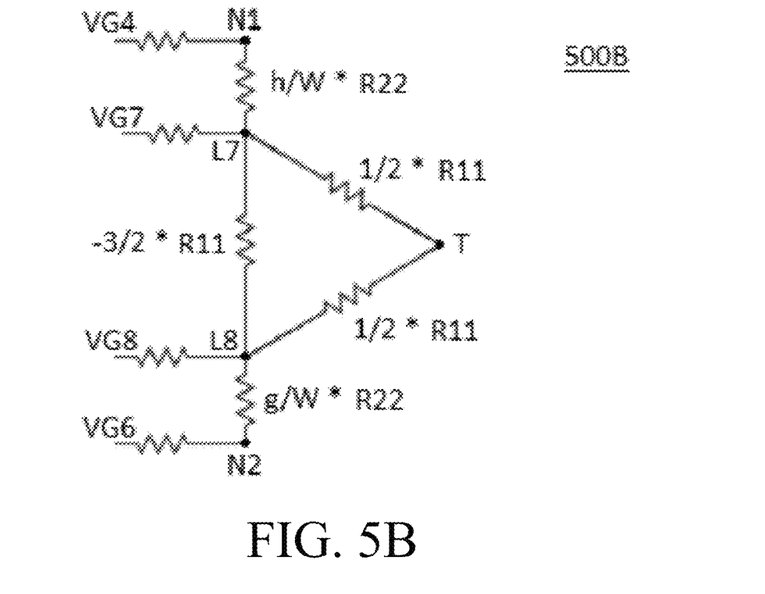
FIG. 5B depicts a gate resistance model, in accordance with some embodiments.

In some embodiments, calculating the effective resistance includes applying the effective resistances R11 and R22 to gate resistance model 500B depicted in FIG. 5B. Gate resistance model 500B thereby includes a delta resistance network of two lumped resistors connected at location T, each having a value of 1/2×R11, and a lumped resistor between locations N1 and N2 having a value of −3/2×R11. Gate resistance model 500B thereby also includes a lumped resistor between location N1 and the delta resistance network having a value of h/W×R22, a lumped resistor between the delta resistance network and location N2 having a value of g/W×R22, a lumped resistor representing gate via VG7 connected to the delta resistance network at location L7, and a lumped resistor representing gate via VG8 connected to the delta resistance network at location L8.

By applying the effective resistances R11 and R22, based on width segments h, t1, d1, and g, to the lumped resistances depicted in FIG. 5B, gate resistance model 500B is usable in one or more modeling operations, e.g., one or more modeling operations executed by EDA system 700, discussed below with respect to FIG. 7, for a circuit based on an IC layout diagram that includes IC layout diagram 500A.

At operation 140, in some embodiments, the effective resistance is used to determine whether or not the IC layout diagram complies with a design specification. In some embodiments, determining whether or not the IC layout diagram complies with the design specification includes performing a simulation based on the IC layout diagram.

In various embodiments, the design specification includes a speed of the IC, a noise performance of the IC, a transient response time of the IC, a cutoff frequency of the IC, or another circuit characteristic potentially affected by a gate resistance.

At operation 150, in some embodiments, the IC layout diagram is modified in response to a determination that the IC layout diagram does not comply with the design specification. In various embodiments, modifying the IC layout diagram includes one or more of changing the location of the gate via along the width or adding another gate via positioned at another location along the width.

At operation 160, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 170, in some embodiments, at least one of one or more semiconductor masks or at least one component in a layer of a semiconductor IC is fabricated, or one or more manufacturing operations are performed based on the IC layout diagram. Fabricating one or more semiconductor masks or at least one component in a layer of a semiconductor IC, and performing one or more manufacturing operations, e.g., one or more lithographic exposures, based on the IC layout diagram are discussed below with respect to FIG. 8.

By executing some or all of the operations of method 100, an effective gate resistance of an IC device is modeled by dividing a gate width into width segments based on one or more gate via locations along the gate width as part of generating a layout diagram of the IC device, thereby improving accuracy and avoiding underestimating gate resistance values compared to gate resistance modeling methods that do not divide a gate width based on one or more gate via locations. Additional accuracy improvements are provided by applying a distributed resistance model to each of the width segments in some embodiments, and by applying effective resistance values to delta resistance networks in some embodiments.

Because improving accuracy and avoiding underestimating gate resistance values act to reduce the number of IC layout revisions, IC devices are manufactured based on the method more efficiently than those manufactured based on methods that do not divide a gate width based on one or more gate via locations.

Figure 7:
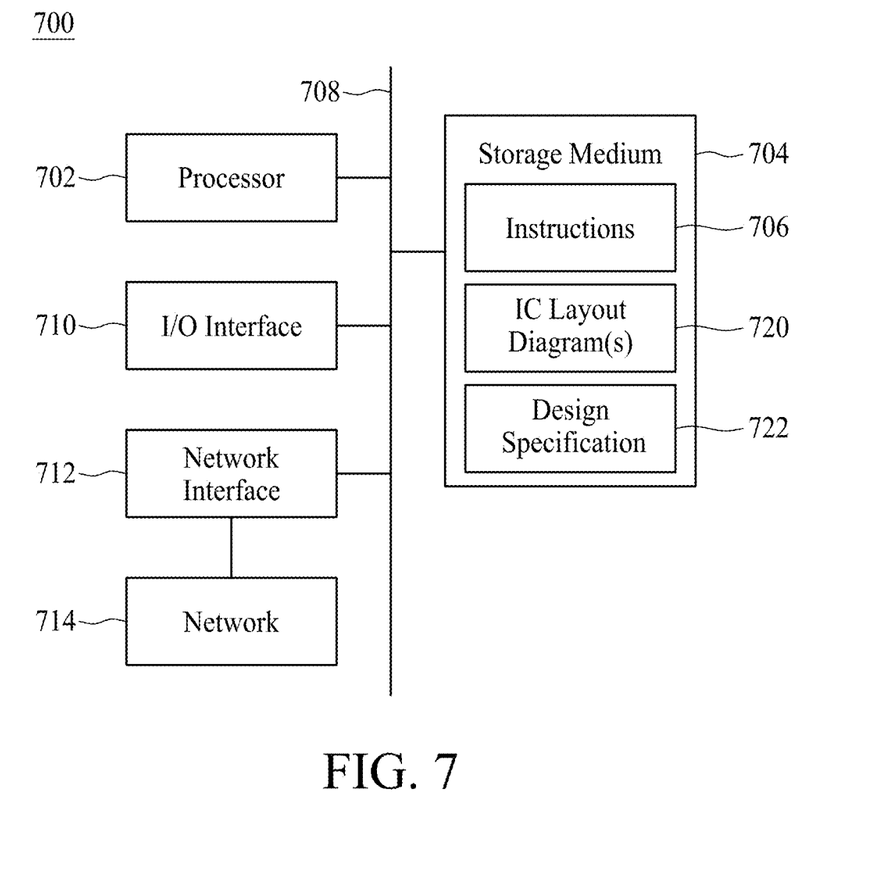
FIG. 7 is a block diagram of an IC device design system, in accordance with some embodiments.

FIG. 7 is a block diagram of IC device design system 700, in accordance with some embodiments. One or more operations of method 100, discussed above with respect to FIG. 1, are implementable using IC device design system 700, in accordance with some embodiments.

In some embodiments, IC device design system 700 is a computing device including a hardware processor 702 and a non-transitory computer-readable storage medium 704. Non-transitory computer-readable storage medium 704, amongst other things, is encoded with, i.e., stores, computer program code 706, i.e., a set of executable instructions. Execution of instructions 706 by hardware processor 702 represents (at least in part) an IC device design system which implements a portion or all of, e.g., a method 100 discussed above with respect to FIG. 1 (hereinafter, the noted processes and/or methods).

Processor 702 is electrically coupled to non-transitory computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and non-transitory, computer-readable storage medium 704 are capable of connecting to external elements via network 714. Processor 702 is configured to execute computer program code 706 encoded in non-transitory computer-readable storage medium 704 in order to cause IC device design system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, non-transitory computer-readable storage medium 704 is an electronic, magnetic, optical, electromagnetic, infrared, and/or a semiconductor system (or apparatus or device). For example, non-transitory computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 704 includes a compact disk-read only memory (CD-ROM), a compact disk-read/write (CD-R/W), and/or a digital video disc (DVD).

In one or more embodiments, non-transitory computer-readable storage medium 704 stores computer program code 706 configured to cause IC device design system 700 to be usable for performing a portion or all of the noted processes and/or methods. In one or more embodiments, non-transitory computer-readable storage medium 704 also stores information which facilitates performing a portion or all of the noted processes and/or methods. In various embodiments, non-transitory computer-readable storage medium 704 stores one or a combination of at least one IC layout diagram 720 or at least one design specification 722, each discussed above with respect to method 100 and FIGS. 1-6.

IC device design system 700 includes I/O interface 710. I/O interface 710 is coupled to external circuitry. In various embodiments, I/O interface 710 includes one or a combination of a keyboard, keypad, mouse, trackball, trackpad, display, touchscreen, and/or cursor direction keys for communicating information and commands to and/or from processor 702.

IC device design system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 700.

IC device design system 700 is configured to receive information through I/O interface 710. The information received through I/O interface 710 includes one or a combination of at least one design rule instructions, at least one set of criteria, at least one design rule, at least one DRM, and/or other parameters for processing by processor 702. The information is transferred to processor 702 via bus 708. IC device design system 700 is configured to transmit and/or receive information related to a user interface through I/O interface 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 100, as discussed above with respect to FIGS. 1-6, IC device design system 700 and a non-transitory computer-readable recording medium, e.g., non-transitory computer-readable recording medium 704, enable the benefits discussed above with respect to method 100.

Figure 8:
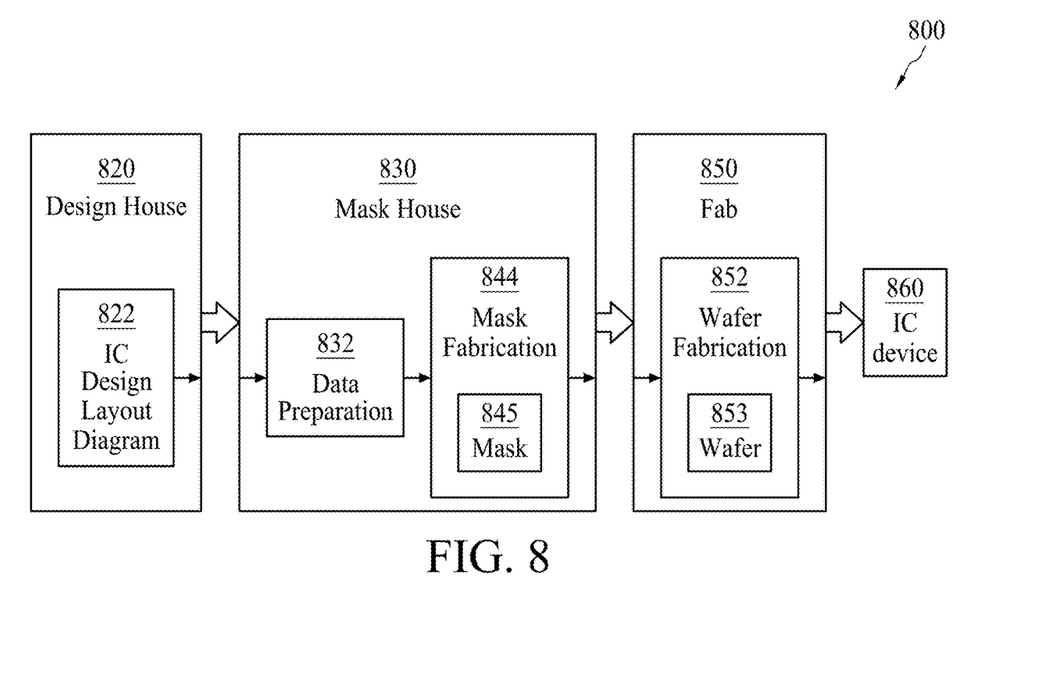
FIG. 8 is a block diagram of an integrated circuit (IC) manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822 based on method 100, discussed above with respect to FIGS. 1-6. IC design layout diagram 822 includes various geometrical patterns that correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure including method 100, discussed above with respect to FIGS. 1-6, to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 1045 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an IC manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram of an IC device includes receiving the IC layout diagram of the IC device, the IC layout diagram including a gate region having a width across an active region, dividing the width into a plurality of width segments based on a location of a gate via, and performing a simulation based on the IC layout diagram including an effective resistance calculated using at least one width segment of the plurality of width segments.

In some embodiments, a method of generating an IC layout diagram of an IC device includes receiving the IC layout diagram of the IC device, the IC layout diagram including a gate region having a width across an active region, dividing the width into a plurality of width segments based on a plurality of locations of gate vias, and performing a simulation based on the IC layout diagram including an effective resistance of the gate region calculated using the plurality of width segments.

In some embodiments, an IC layout diagram generation system includes a processor and a non-transitory, computer readable storage medium including computer program code for one or more programs. The non-transitory, computer readable storage medium and the computer program code are configured to, with the processor, cause the system to receive an IC layout diagram including a gate region having a width across an active region, identify a width segment of the width based on a location of a gate via, and determine whether or not the IC layout diagram complies with a design specification based on an effective resistance calculated from the width segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit (IC) layout diagram of an IC device, the method comprising:
    receiving the IC layout diagram of the IC device, the IC layout diagram comprising a gate region having a width across an active region;
    dividing the width into a plurality of width segments based on a location of a gate via; and
    performing a simulation based on the IC layout diagram including an effective resistance calculated using at least one width segment of the plurality of width segments.

2. The method of claim 1, wherein the dividing the width into the plurality of width segments comprises dividing the width into four width segments.

3. The method of claim 2, wherein
    a first width segment extends from a first edge of the active region to the location of the gate via,
    a second width segment extends from the location of the gate via to a second location midway along the width,
    a third width segment extends from the second location to a third location between the second location and a second edge of the active region, and
    a fourth width segment extending from the third location to the second edge of the active region.

4. The method of claim 3, wherein the location of the gate via and the third location are symmetric about the second location.

5. The method of claim 1, further comprising calculating the effective resistance by applying a distributed resistance model to the plurality of width segments.

6. The method of claim 5, wherein the calculating the effective resistance comprises using a delta resistance network to model the gate region.

7. The method of claim 6, wherein the using the delta resistance network comprises positioning the effective resistance between the location of the gate via and a location midway along the width.

8. The method of claim 7, wherein the calculating the effective resistance comprises using the following equation:

$$R=(Rg/6) \times (1-3x+3x^2),$$

wherein R is the effective resistance value, Rg is a resistance corresponding to the gate region along the width, and x is a length of a width segment of the plurality of width segments divided by the width.

9. The method of claim 1, wherein the performing the simulation based on the IC layout diagram is part of determining whether or not the IC layout diagram complies with a design specification.

10. A method of generating an integrated circuit (IC) layout diagram of an IC device, the method comprising:
receiving the IC layout diagram of the IC device, the IC layout diagram comprising a gate region having a width across an active region;
dividing the width into a plurality of width segments based on a plurality of locations of gate vias; and
performing a simulation based on the IC layout diagram including an effective resistance of the gate region calculated using the plurality of width segments.

11. The method of claim 10, further comprising:
calculating the effective resistance by applying a distributed resistance model to the plurality of width segments; and
modeling the gate region using a delta resistance network.

12. The method of claim 11, wherein
the plurality of locations includes a first location between first and second edges of the active region and a second location between the first and second edges of the active region, and
the modeling the gate region using the delta resistance network includes positioning the effective resistance between the first location and a third location midway along the width and between the second location and the third location.

13. The method of claim 12, wherein the calculating the effective resistance comprises using the following equation:

$$R=(Rg/24) \times (3x^3+3y^3+3x^2+3y^2+6xy-3x^2y-3y^2x-3x-3y+1),$$

wherein R is the resistance value, Rg is a resistance corresponding to the gate region along the width, x is a length of a first width segment of the plurality of width segments divided by the width, and y is a length of a second width segment of the plurality of width segments divided by the width.

14. The method of claim 13, wherein the plurality of locations further includes a fourth location at the first edge of the active region and a fifth location at the second edge of the active region.

15. The method of claim 11, wherein
the plurality of locations includes a first location at a first edge of the active region, a second location midway along the width, and a third location at a second edge of the active region, and
the modeling the gate region using the delta resistance network includes positioning the effective resistance between the second location and a gate via corresponding to the second location.

16. The method of claim 11, wherein the calculating the effective resistance comprises using the following equation:

$$R=(Rg/24) \times (1-3x+3x^2),$$

wherein R is the effective resistance value, Rg is a resistance corresponding to the gate region along the width, and x is a length of a width segment of the plurality of width segments divided by the width.

17. The method of claim 16, wherein
the modeling the gate region using the delta resistance network includes positioning another effective resistance between the first location and the gate via corresponding to the second location, and
the method further comprises calculating the another effective resistance by using the following equation:

$$Ran=Rg-(3 \times R),$$

wherein Ran is the another effective resistance.

18. An integrated circuit (IC) layout diagram generation system comprising:
a processor; and
a non-transitory, computer readable storage medium including computer program code for one or more programs, the non-transitory, computer readable storage medium and the computer program code being configured to, with the processor, cause the system to:
receive an IC layout diagram comprising a gate region having a width across an active region;
identify a width segment of the width based on a location of a gate via; and
determine whether or not the IC layout diagram complies with a design specification based on an effective resistance calculated from the width segment.

19. The IC layout diagram generation system of claim 18, wherein the computer readable storage medium and the computer program code are configured to, with the processor, cause the system to store the IC layout diagram in a storage device.

20. The IC layout diagram generation system of claim 18, wherein the IC layout diagram corresponds to an IC device, and the design specification is one of a speed of the IC device or a noise performance of the IC device.

* * * * *